(12) United States Patent
Kim et al.

(10) Patent No.: US 8,151,012 B2
(45) Date of Patent: Apr. 3, 2012

(54) VIRTUAL ROW BUFFERS FOR USE WITH RANDOM ACCESS MEMORY

(75) Inventors: Changkyu Kim, San Jose, CA (US); Albert Lin, Stanford, CA (US); Christopher J. Hughes, Cupertino, CA (US); Anthony-Trung D. Nguyen, Castro Valley, CA (US); Yen-Kuang Chen, Cupertino, CA (US); Zeshan A. Chishti, Hillsboro, OR (US); Bryan K. Casper, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 229 days.

(21) Appl. No.: 12/567,638

(22) Filed: Sep. 25, 2009

(65) Prior Publication Data

US 2011/0078340 A1    Mar. 31, 2011

(51) Int. Cl.
*G06F 3/00* (2006.01)
(52) U.S. Cl. ......... 710/15; 710/1; 710/3; 710/4; 710/5; 710/8; 710/17; 710/18; 710/19; 710/20; 710/29; 710/33
(58) Field of Classification Search .............. 710/1, 3, 710/4, 5, 8, 15, 17, 18, 19, 20, 29, 33
See application file for complete search history.

(56) References Cited

U.S. PATENT DOCUMENTS

| 4,649,516 | A | 3/1987 | Chung et al. | |
|---|---|---|---|---|
| 6,199,151 | B1 * | 3/2001 | Williams et al. | 711/203 |
| 6,321,328 | B1 * | 11/2001 | Karp et al. | 712/225 |
| 7,343,477 | B1 * | 3/2008 | Thatipelli et al. | 712/218 |
| 7,590,876 | B2 * | 9/2009 | Chu et al. | 713/322 |
| 2006/0236036 | A1 * | 10/2006 | Gschwind et al. | 711/137 |
| 2009/0164700 | A1 * | 6/2009 | Chen et al. | 711/103 |
| 2010/0180081 | A1 * | 7/2010 | Bose et al. | 711/122 |
| 2010/0281221 | A1 * | 11/2010 | Cantin et al. | 711/132 |

* cited by examiner

*Primary Examiner* — Tariq Hafiz
*Assistant Examiner* — Jasjit Vidwan
(74) *Attorney, Agent, or Firm* — Blakely, Sokoloff, Taylor & Zaffman LLP

(57) ABSTRACT

Methods, apparatuses and systems to decrease the energy consumption of a memory chip while increasing its effect bandwidth during the execution of any workload. Methods, apparatuses and systems may allow a memory chip utilize a plurality of virtual row buffers to respond to requests for data included in a memory array block. Methods, apparatuses and systems may further eliminate or reduce the cost associated with transferring unnecessary data from a memory array block to row buffers by altering the data transfer size between a memory array block and a row buffer.

16 Claims, 5 Drawing Sheets

VIRTUAL ROW BUFFERS FOR USE WITH RANDOM ACCESS MEMORY

FIELD

Embodiments of the invention generally pertain to memory devices and more specifically to reducing energy consumption and increasing the effective bandwidth of memory devices.

BACKGROUND

Computer systems use memory devices, such as Dynamic Random Access Memory (DRAM) devices, to store data accessed by a workload. DRAM chips or packages typically include at least one array bank, and a row buffer coupled to that array bank. The row buffer is critical to the operation of the DRAM. To read from or write to a row included in the DRAM array, the requested row is first activated/opened in the array bank, and then the contents of the activated/opened row are transferred (i.e., copied) into the row buffer.

The latency and energy cost involved in transferring the contents of a requested row from an array bank to its corresponding row buffer are considerable. Furthermore, the transfer is destructive—the row must be written back into the DRAM array (referred to as a row precharge or close) before activating/opening another row.

A row buffer hit occurs when a memory request is satisfied by an already opened row, whereas as a row buffer miss occurs when a memory request is satisfied by a row different than the one kept in the buffer. A DRAM controller may employ a specific row buffer management policy to control how and when a row buffer is precharged. For example, an open page policy executes a row precharge only when a different row in the array bank is to be transferred to the row buffer. An open page policy allows for a series of row buffer hits if a workload exhibits a high spatial locality (i.e., requests will access the same open row repeatedly and consecutively before accessing a different row); however, the use of such a row buffer management, in conjunction with the typical DRAM package consisting of one row buffer per array bank, will not help reduce the operating costs of memory access requests when used on a system executing a workload with low spatial locality (e.g., multi-threaded workloads).

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
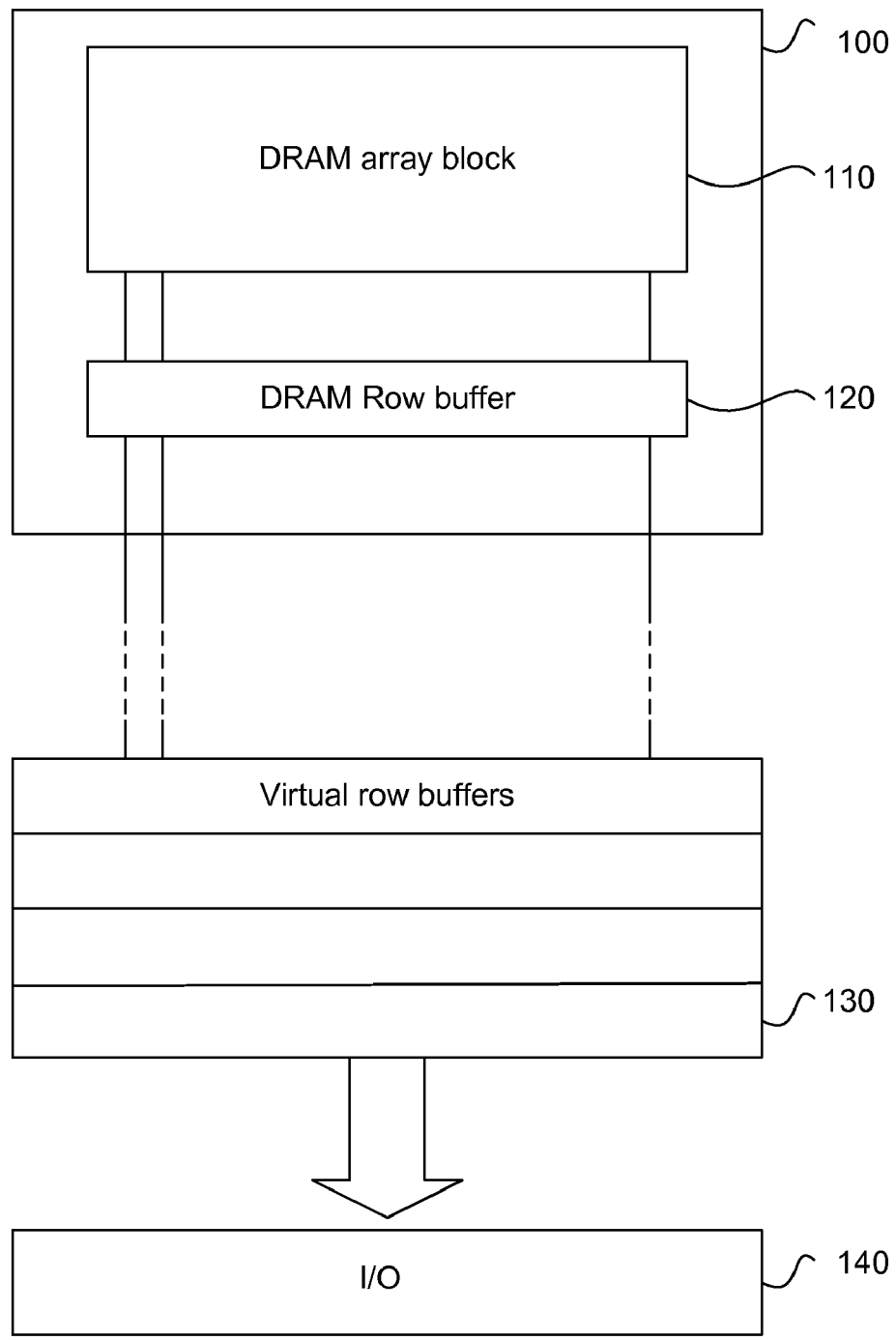
FIG. 1 is a block diagram of system or apparatus including a DRAM chip utilizing a plurality of virtual row buffers.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the present invention relate to methods, apparatuses and systems to reduce energy consumption and increase the effective bandwidth of memory devices. Embodiments of the present invention may be represented by additional row buffers coupled to a DRAM chip or package, and a memory controller to efficiently manage row buffers used by a DRAM chip or package. Embodiments of the invention represented as including DRAM chips or packages are to be construed as example embodiments only, and thus not limited to use with DRAM chips or packages. Those skilled in the art know that the following embodiments may be used with other memory technologies (e.g., SRAM, PCM).

A typical DRAM package has a standard interface with internal structures including at least one array bank that is coupled to a single row buffer. Rather than modify the internal structure of a DRAM to include multiple row buffers per array bank, additional row buffers, herein referred to as Virtual Row Buffers (VRBs), may be utilized to increase the effective bandwidth of the DRAM structure by increasing the likelihood of (virtual) row buffer hits. In one embodiment, a plurality of VRBs are included in a logic chip coupled to a DRAM chip or package. The logic chip may further include a memory controller, or a processor if, for example, the system has a DRAM chip directly attached to a processor/CPU chip or package (e.g., stacked DRAM).

Embodiments of VRBs may be physically implemented into a single logic chip. In other embodiments, VRBs may be implemented within the last level of cache of a processor core or a plurality of processor cores. Each of the above embodiments allows for the exploitation of spatial locality in, for example, multi-threaded workloads without changing the physical structures of a typical DRAM chip.

Row buffer memory may further be more efficiently managed and controlled compared to the prior art. To read or write to an element of a DRAM array, the row including the element must be activated/opened and transferred into a row buffer (or virtual row buffer). There is a high cost, in terms of energy and latency, associated with transferring the contents of an entire row from the DRAM array to a row buffer. If only a small portion of the row is used by the memory access request, then the cost was wasteful.

To eliminate or reduce the cost associated with transferring unnecessary data from a DRAM array block to row buffers, embodiments of the present invention may alter the data transfer size between a DRAM array block and a row buffer. For example, if the size of the requested data included in a row of a DRAM array bock is small (e.g., 128 B is to be used, and the row size is 4 kB), then only a small portion of the row (e.g., 128 B) will be transferred from the DRAM to a row buffer (or VRB). On the other hand, if a large element of a row of a DRAM array is expected to be needed from the row, a larger portion of the row or the entire row itself may be transferred to a row buffer (or VRB). The above adaptive-sized transferred portions of a row included in a DRAM array block are herein referred to as Adaptive Virtual Row Buffers (A-VRBs).

In one embodiment, a virtual row buffer manager utilizes A-VRBs within a plurality of VRBs to reduce the overhead of virtual row buffer misses while retaining the benefits of virtual row buffer hits. The technical effect of the above embodiment is that it will significantly decrease the energy consumption of a DRAM chip while increasing its effect bandwidth during the execution of any workload.

FIG. 1 is a block diagram of system or apparatus including a DRAM chip utilizing a plurality of virtual row buffers. DRAM package 100 includes DRAM array block 110 and row buffer 120. DRAM package 100 is further coupled to a plurality of VRBs, 130. In one embodiment, VRBs 130 may be included in a single logic chip coupled to DRAM package 100. In another embodiment, VRBs are included as a last level of cache used by a processor (or a plurality of processor cores). Those skilled in the art know that cache memory is managed differently than row buffer memory (e.g., cache memory lines are typically much smaller than a contiguous row stored in a row buffer). Thus, VRBs included as a last level of cache would require row buffer memory management.

In prior art, DRAM package 100 would be coupled to I/O 140 in order to receive and fulfill memory access requests from other parts of the system or apparatus. Thus, requests to read from or write to contents of DRAM array block 110 would be fulfilled by transmitting the contents of row buffer 120 to I/O 140. DRAM management policies determine when a row must be written back into the DRAM array block—i.e., a row precharge/close. A row precharge may occur immediately after each row access (i.e., a closed page policy) or immediately before opening a different row (i.e., an open page policy). A row buffer hit occurs when a memory request is satisfied by an already opened row. A row buffer miss occurs when a different row of DRAM array block 110 than the one kept in the row buffer 120 is required to fulfill a memory access request. In an open page policy, workloads with high spatial locality benefit from the row remaining open as long as possible; however, workloads with low spatial locality (e.g., multi-threaded workloads) will cause a high number of row misses.

In FIG. 1, requests to read from or write to contents of DRAM array block 110 would be fulfilled by transmitting the contents of VRBs 130 to I/O 140. Executing a multi-threaded workload utilizing said DRAM configuration, managed via an open page policy, would result in a significantly increased amount of row hits compared to the prior art. For example, each thread of a multi-threaded workload may individually contain high spatial locality, but each thread accesses a different row in DRAM array buffer 110. In the prior art, execution of said multi-threaded workload would incur a significant amount of row misses because instructions would not consecutively access the same row of DRAM array buffer 110. In contrast, the apparatus or system of FIG. 1 would be able to store each row accessed by the multi-threaded workload in VRBs 130,—thus incurring a high amount of VRB hits despite the low-spatial locality of the multi-threaded workload.

While the benefits discussed above relate to open page policies, those skilled in the art understand that a utilizing VRBs in conjunction with DRAM controllers employing closed page policies will also increase DRAM bandwidth, as there would be more virtual buffers to be accessed by I/O 140.

Figure 2:
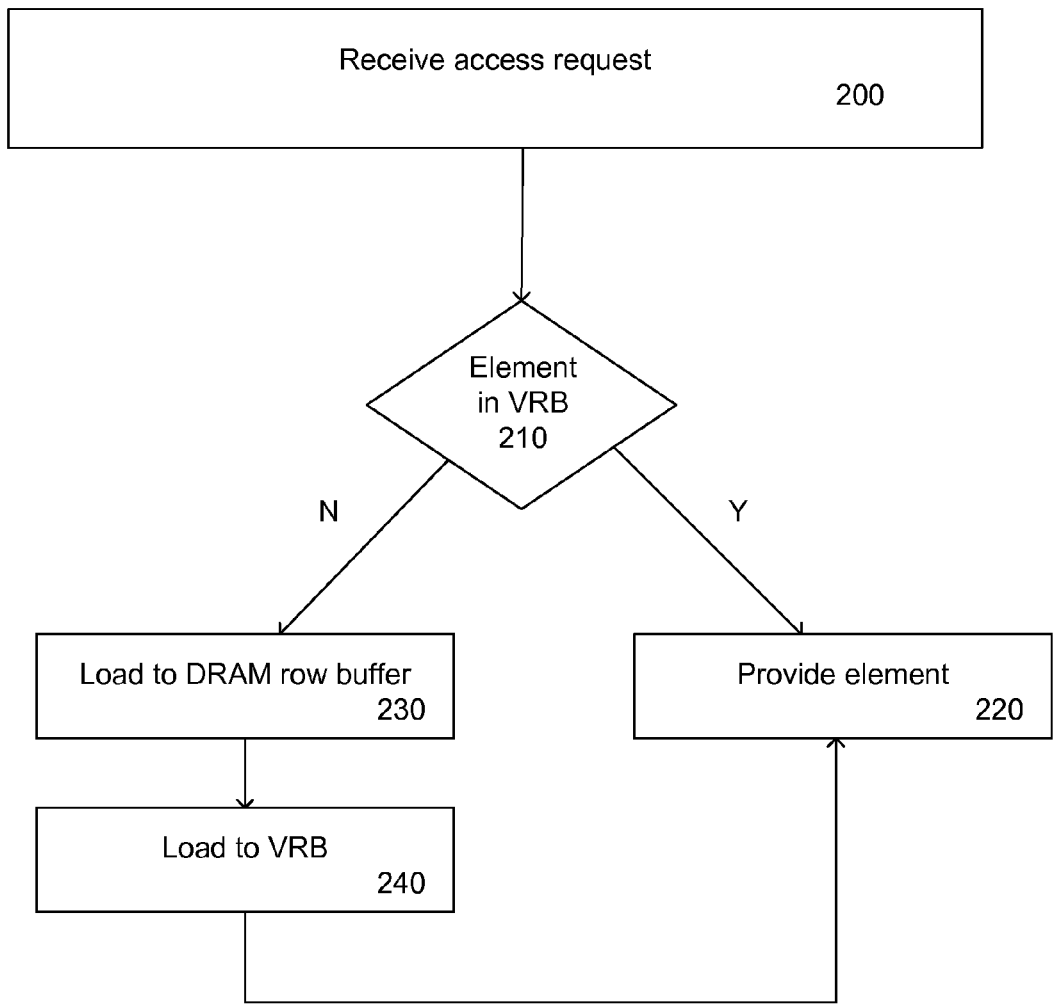
FIG. 2 is a flow diagram of an embodiment of a process for utilizing virtual row buffers.

FIG. 2 is a flow diagram of an embodiment of a process for utilizing VRBs. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

A request to access a row of a DRAM array block is received, 200. Before the row of the DRAM array block is activated and transferred into a row buffer, a determination is made whether the row is included in a plurality of virtual row buffers coupled to the DRAM chip, 210. If the element is not present in the VRBs, the row of the DRAM array block is loaded into the row buffer of the DRAM, 230. The contents of the row buffer are then loaded into one of the plurality of virtual row buffers, 240.

In the event that each of the plurality of VRBs already contains contents, any replacement algorithm known in the art may be used to close one of the plurality of row buffers before loading it—i.e., replacing the contents of one of the VRBs. For example, after a VRB miss (and prior to elements 230 and 240 of the example process), the least recently used virtual row buffer may be written back to the row buffer of the DRAM chip, and then back the DRAM array block. Alternatively, the least used virtual row buffer may be replaced.

Once the requested row is loaded into the VRBs (or if the requested row was already opened and present in the VRB), the row is provided to fulfill the memory access request, 220.

Figure 3:
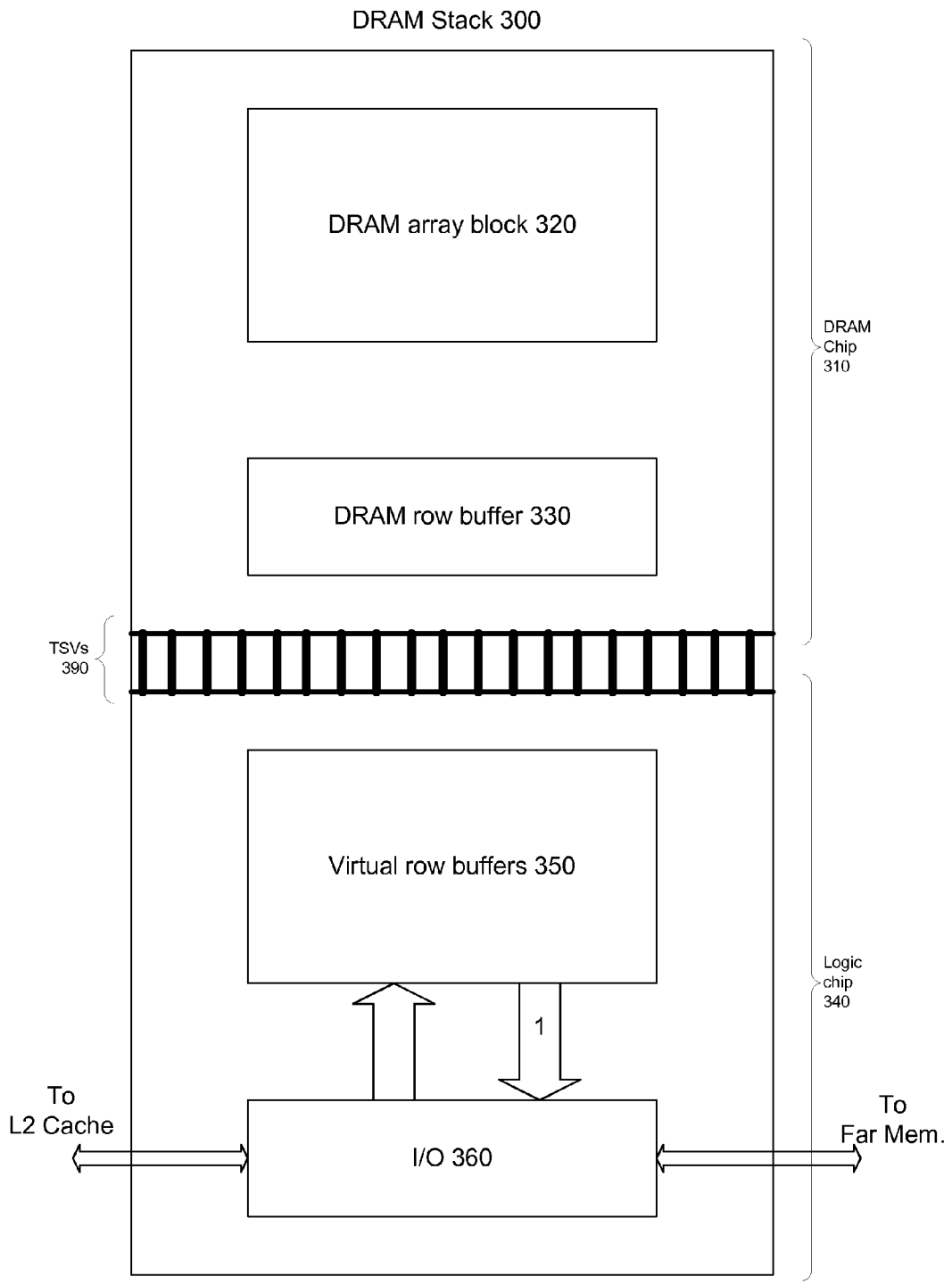
FIG. 3 is a block diagram a DRAM chip utilizing virtual row buffers stored in a logic chip.

FIG. 3 is a block diagram a DRAM chip utilizing virtual row buffers stored in a logic chip. A system or apparatus may include DRAM stack 300. DRAM stack 300 comprises a standard DRAM chip 310, including DRAM array block 320 and internal row buffer 330, coupled to logic chip 340, including VRBs 350 and I/O logic 360 for communicating with other parts of the system or apparatus. In this example embodiment, DRAM chip 310 and logic chip 340 are connected via through-silicon-vias (TSVs) 390.

FIG. 3 illustrates that VRBs can easily be integrated into systems expecting common DRAM chips. Other components of the system do not require updates or changes to utilize DRAM stack 300. The system will use less energy and receive increased bandwidth from DRAM chip 310.

Figure 4:
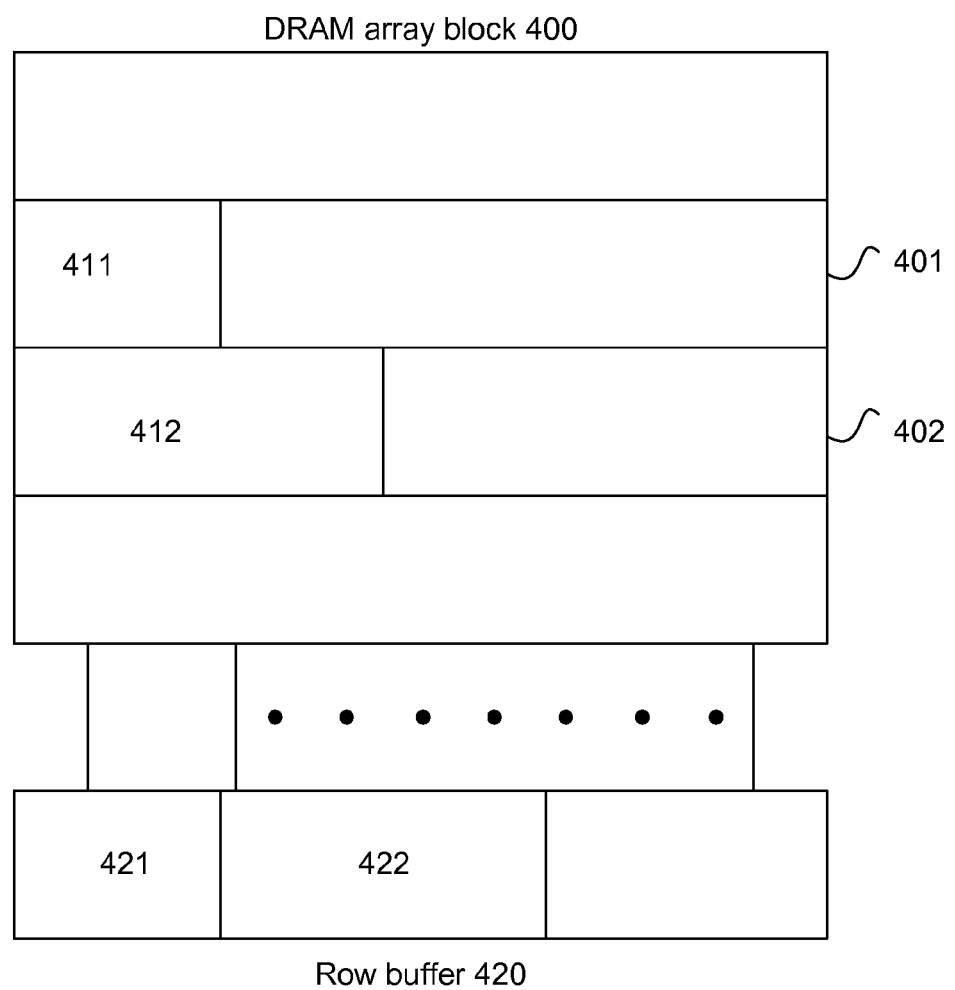
FIG. 4 is a block diagram of a row buffer utilizing adaptive row buffer management.

FIG. 4 is a block diagram of a plurality of virtual row buffers utilizing adaptive row buffer management. The data transfer size between DRAM array block 400 and row buffer 420 may change depending of workload characteristics. Row buffer 420 may be included in a DRAM chip, or may be included in a plurality of VRBs coupled to a DRAM chip.

In the example illustrated in FIG. 4, a workload is expected to access elements 411 and 412 of DRAM array block 400. Element 411 is included in row 401, and element 412 is included in row 402 (an "element" may represent any amount of data in a row of a DRAM array block). Rather than transferring all the data stored in rows 401 and 402 into row buffer 420 (assuming only one row buffer may be used, each row would need to be separately loaded, accessed, and closed), elements 411 and 412 are both loaded into row buffer 420, occupying adaptive-sized row buffers 421 and 422.

Monitoring logic may be used to monitor a workload and identify workflow characteristics. Workload characteristics may be used to determine the size of A-VRBs 421 and 422. In one embodiment, a stream detector/prefetcher (e.g., a hardware stride prefetcher included in a CPU core) is used to determine the spatial locality of the workload. In response to detecting the workload has high spatial locality, the size of A-VRBs 421 and 422 will be increased, as stream access patterns typically use many elements of a row of a DRAM array block.

In another embodiment, the average spatial locality of the workload may be determined statically by software hints (provided by programmers or compilers) from the workload. The size of A-VRBs 421 and 422 may be updated as a hint detector receives hints from the software. In one embodiment, compiler analysis and profiling may be used to provide the software hints. This average spatial locality will dictate the size of A-VRBs throughout the workload execution.

In another embodiment, spatial locality of the workload as it progresses through different phases may be detected. The size of A-VRBs, such as 421 and 422, may be updated throughout the workload execution to keep up with any changes in the workload's needs. Hardware logic may be implemented to detect spatial locality of the workload. In one embodiment, counters that measure the amount of data used from each row are implemented to measure the average amount of data, and/or the range of data, used from each row before it is closed. Other counters may be implemented to count the number of row misses and row accesses. After a number of row buffer misses, the row access counter is analyzed. If the row access counter exceeds a threshold value, the size of A-VRBs, such as those illustrated in 421 and 422 is increased. If the row counter value is below the threshold value, the size of A-VRBs is decreased.

Figure 5:
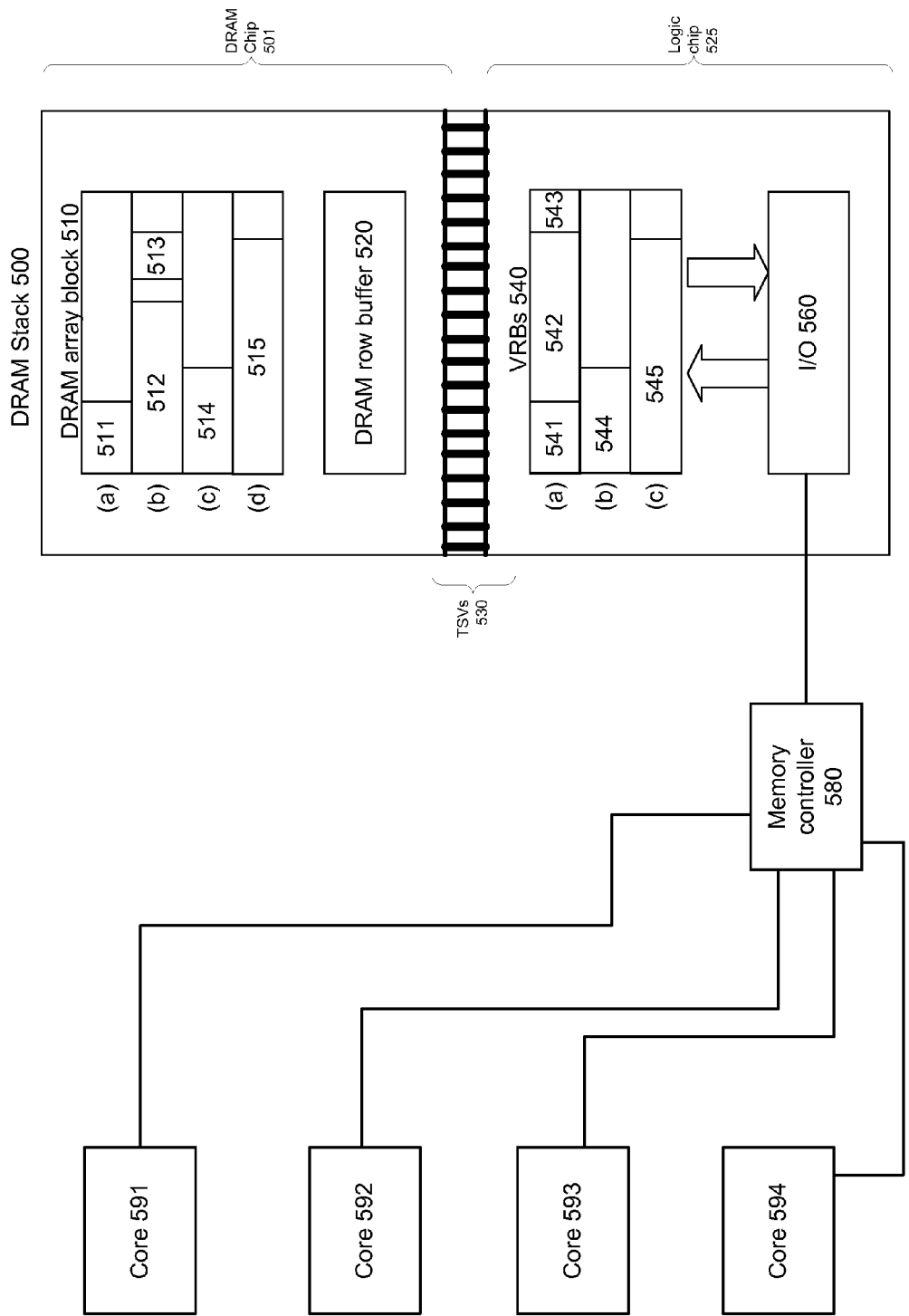
FIG. 5 is a block diagram of a system or apparatus including a DRAM chip utilizing adaptive virtual row buffers stored in a plurality of virtual row buffers included in a logic chip.

FIG. 5 is a block diagram of a system or apparatus including a DRAM chip utilizing A-VRBs stored in a plurality of VRBs included in a logic chip. The system or apparatus may include DRAM stack 500. DRAM stack 500 comprises a standard DRAM chip 501, including DRAM array block 510 and internal row buffer 520. DRAM array block 510 comprises rows 510(*a*)-510(*c*). DRAM chip 501 is coupled to logic chip 525, which includes VRBs 540 and I/O logic 560 for communicating with other parts of the system or apparatus. In this example embodiment, DRAM chip 501 and logic chip 525 are coupled via TSVs 530.

In the embodiment illustrated in FIG. 5, processor cores 591-594 are executing a multi-threaded workload, wherein each processor core executes one of the threads. In this example, core 591 requests access to element 511 of DRAM array block 510, core 592 requests access to elements 512 and 513, core 593 requests access to element 514, and core 594 requests access to 515.

Memory controller 580 receives the above requests, and determines whether VRBs 540 include any of the data included in elements 511-514. For example, if one of the row buffers of VRBs 540 already includes the row (a) of DRAM array block 510, then element 511 can immediately be passed via I/O 560 to fulfill the request of processor core 591.

In the embodiment illustrated in FIG. 5, no data of elements 511-514 are included in VRBs 540 when memory controller 580 receives the requests from processor cores 591-594. Therefore, each of the elements requested by cores 591-594 are transferred into DRAM row buffer 520, and then into A-VRBs 541-545. Each of A-VRBs 541-545 are included in VRBs 540(*a*)-540(*c*). In this example embodiment, because of the adapted sizes of A-VRBs 541-545, only three rows of VRBs 540 are required to store the requested data (whereas the requested data is stored in four rows, 510(*a*)-510(*d*), in DRAM array block 510).

A-VRBs 541-545 will remain accessible via VRBs 525 throughout the execution of the multi-threaded workload (space permitting), thus generating a high amount of VRB hits. As mentioned above, the size of A-VRBs utilized by the apparatus or system of FIG. 5 may be updated throughout workload execution based on any changes in the workload's characteristics or requirements. The embodiment illustrated in FIG. 5 will deliver significantly higher DRAM bandwidth and significantly reduce the energy consumption of memory access requests included in a workload.

Various components referred to above as processes, servers, or tools described herein may be a means for performing the functions described. Each component described herein includes software or hardware, or a combination of these. The components can be implemented as software modules, hardware modules, special-purpose hardware (e.g., application specific hardware, ASICs, DSPs, etc.), embedded controllers, hardwired circuitry, etc. Software content (e.g., data, instructions, configuration) may be provided via an article of manufacture including a computer storage readable medium, which provides content that represents instructions that can be executed. The content may result in a computer performing various functions/operations described herein. A computer readable storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable storage medium may also include a storage or database from which content can be downloaded. A computer readable medium may also include a device or product having content stored thereon at a time of sale or delivery. Thus, delivering a device with stored content, or offering content for download over a communication medium may be understood as providing an article of manufacture with such content described herein.

The invention claimed is:

1. An apparatus comprising:
a memory chip including
an array block, and
a first buffer coupled to the array block;
a plurality of additional buffers coupled to the memory chip;
I/O logic coupled to the memory chip to receive memory access requests for elements of the array block; and
monitoring logic, coupled to the I/O logic, to monitor a workload of the apparatus by tracking additional buffer hits and misses;
the I/O logic further coupled to a memory controller, the memory controller, in response the received memory access requests, to
determine if the element is included in the additional buffers,
in response to a determination that the element is included in the additional buffers, provide the element via the additional buffers in response to the memory access request, and
in response to a determination that the element is not included in the additional buffers, load the element of the array block into the first buffer, load a portion of the contents of the first buffer into the additional buffers, a size of the portion is smaller than the first portion and is based, at least in part, on a spatial locality of the workload of the apparatus, and provide the element via the additional buffers in response to the memory access request.

2. The apparatus of claim 1, further comprising:
a plurality of Through-Silicon Vias (TSVs), wherein the additional buffers are included in a logic chip coupled to the memory chip via the TSVs.

3. The apparatus of claim 1, wherein the additional buffers are included in a processor chip.

4. The apparatus of claim 1, wherein the monitoring logic comprises a hardware stride prefetcher included in a CPU core, and the characteristic of the workload for the apparatus comprises whether the workload includes a streaming access pattern.

5. The apparatus of claim 1, wherein the monitoring logic comprises a hint detector, and the characteristic of the workload for the apparatus comprises a software hint.

6. A method comprising:
monitoring a workload for an apparatus including a memory chip, the memory chip further including an array block coupled to a buffer, the array block to include a plurality of rows, each of the rows comprising a row size, wherein the monitoring is executed via a counter;
detecting an access to one of the plurality of rows included in the array block; and
loading a portion of the array block to the buffer, the size of the portion determined based, at least in part, on a characteristic of the workload for the apparatus, wherein the size of the portion is smaller than the row size of the array block, the size of the portion to be increased if a ratio of buffer misses to buffer hits exceeds a threshold value, and the characteristic of the workload comprises a number of row buffer misses and hits tracked via the counter.

7. The method of claim 6, wherein monitoring the workload is executed via a hardware stride prefetcher included in a CPU core, and the characteristic of the workload comprises whether the workload includes a streaming access pattern.

8. The method of claim 6, wherein monitoring the workload is executed via a hint detector, and the characteristic of the workload comprises a software hint.

9. The method of claim 6, wherein the buffer comprises a memory row buffer included in the memory chip.

10. The method of claim 6, wherein the buffer is included in a logic chip coupled to the memory chip.

11. A system comprising:
a memory chip including an array block, the array block coupled to a buffer and to further include a plurality of rows, each row comprising a row size;
I/O logic coupled to the memory chip;
monitoring logic, coupled to the I/O logic, to monitor a workload for the system and to determine a characteristic of the workload, wherein the monitoring logic comprises a counter; and
a memory controller, coupled to the I/O logic, to detect an access to one of the plurality of rows included in the array block and to load a portion of the array block to the buffer, the size of the portion determined based, at least in part, on the characteristic of the workload, wherein the size of the portion is smaller than the row size of the array block, the size of the portion to be increased if a ratio of buffer misses to buffer hits exceeds a threshold value, and the characteristic of the workload comprises a number of buffer misses and hits tracked via the counter.

12. The system of claim 11, wherein the monitoring logic comprises a hardware stride prefetcher included in a CPU core, and the characteristic of the workload comprises whether the workload includes a streaming access pattern.

13. The system of claim 11, wherein the monitoring logic comprises a hint detector, and the characteristic of the workload comprises a software hint.

14. The system of claim 11, wherein the buffer comprises a memory row buffer included in the memory chip.

15. The system of claim 11, further comprising:
a logic chip coupled to the memory chip; wherein the buffer is included in the logic chip.

16. The system of claim 15, further comprising:
a plurality of Through-Silicon Vias (TSVs), wherein logic chip is coupled to the memory chip via the TSVs.

* * * * *